United States Patent [19]
Mahale et al.

[11] Patent Number: 6,115,389
[45] Date of Patent: Sep. 5, 2000

[54] AUTO-NEGOTIATION FOR MULTIPLE PORTS USING SHARED LOGIC

[75] Inventors: Dinesh Mahale, Newark; Thomas J. Runaldue, San Jose, both of Calif.

[73] Assignee: Advanced Micro Devices, Inc., Sunnyvale, Calif.

[21] Appl. No.: 09/291,030

[22] Filed: Apr. 14, 1999

Related U.S. Application Data

[60] Provisional application No. 60/082,183, Apr. 17, 1998.

[51] Int. Cl.[7] .............................. H04B 7/212; H04L 12/43
[52] U.S. Cl. .......................... 370/442; 370/445; 370/465
[58] Field of Search .................................... 370/243, 294, 370/296, 434, 445, 447, 465, 466, 461, 462, 442, 431, 437, 458

[56] References Cited

U.S. PATENT DOCUMENTS

| | | | |
|---|---|---|---|
| 5,546,543 | 8/1996 | Yang et al. ............................. | 395/250 |
| 5,586,117 | 12/1996 | Edem et al. ........................... | 370/466 |
| 5,610,903 | 3/1997 | Grayford ................................ | 370/213 |
| 5,737,108 | 4/1998 | Bunch et al. ........................... | 359/152 |
| 5,774,658 | 6/1998 | Kalkunte ................................ | 370/438 |
| 5,809,026 | 9/1998 | Wong et al. ............................ | 370/445 |
| 5,809,249 | 9/1998 | Julyan ............................... | 395/200.53 |
| 5,883,894 | 3/1999 | Patel et al. ............................. | 370/438 |
| 5,907,553 | 5/1999 | Kelly et al. ............................ | 370/433 |
| 5,922,052 | 7/1999 | Heaton .................................. | 709/223 |
| 5,923,663 | 7/1999 | Bontemps et al. ..................... | 370/445 |
| 5,946,301 | 8/1999 | Swanson et al. ...................... | 370/252 |

*Primary Examiner*—Chau Nguyen
*Assistant Examiner*—Chiho Andrew Lee

[57] ABSTRACT

A data communication device having multiple ports is provided with an auto-negotiation system for performing auto-negotiation with multiple link partners connected to the ports. The auto-negotiation system has a memory and an auto-negotiation unit including transmit, receive and arbitration state machines for performing transmit, receive and arbitration state diagrams compliant with the IEEE 802.3 Standard. The auto-negotiation unit operates in a time-division multiplexing mode using successive time slots for supporting auto-negotiation operations for different ports. The memory is used for storing state diagram variables for a port in a time interval between the time slots assigned to that port.

14 Claims, 4 Drawing Sheets

AUTO-NEGOTIATION FOR MULTIPLE PORTS USING SHARED LOGIC

This application claims priority of U.S. provisional application No. 60/082,183 filed Apr. 17, 1998, entitled "Quad Fast Ethernet Transceiver for 10 BASE-T/100 BASE-X (QFEX 10/100)", the entire disclosure of which is incorporated by reference herein.

FIELD OF THE INVENTION

The present invention relates to data communications, and more particularly, to an auto-negotiation system that supports multiple ports of a data communication device.

BACKGROUND ART

Auto-negotiation defined in the IEEE Std. 802.3u 100BASE-T supplement Clause 28 makes it possible for data communication devices to exchange information about their abilities over a link segment. This, in turn, allows the devices to perform automatic configuration to achieve the best possible mode of operation over a link. At a minimum, auto-negotiation can provide automatic speed matching for multi-speed communication devices at each end of a link. Multi-speed Ethernet interfaces can then take advantage of the highest speed offered by a multi-speed hub port.

The auto-negotiation protocol includes automatic sensing for other capabilities as well. For example, a hub that is capable of supporting full-duplex operation on some or all of its ports can use the auto-negotiation protocol to inform communication devices that they may operate in a full-duplex mode. Interfaces connected to the hub that also support full-duplex operation can then configure themselves to use the full-duplex node in interaction with the hub.

Thus, auto-negotiation allows a data communication device to select the best transmission speed and transmission mode based on capabilities of the device at opposite side of the link. For example, device A supports transmission at 10 Mbps and 100 Mbps in half-duplex and full-duplex modes, and device B connected to device A supports 100 Mbps fill-duplex mode. Since both ends of the link support 100 Mbps full-duplex mode, device A selects this mode. However, if device C connected to device A supports only 100 Mbps half-duplex mode, device A automatically detects these capabilities of device C, and selects 100 Mbps half-duplex mode.

A typical auto-negotiation block has transmit, receive and arbitration state machines for each port supported by a data communication device. These state machines are defined by the transmit, receive and arbitration state diagrams respectively provided in FIGS. 28-14, 28-15 and 28-16 of the IEEE Std. 802.3 100BASE-T supplement. For example, FIG. 1 illustrates a conventional auto-negotiation block A-NEG in a data communication device having ports 0, 1, 2 and 3 for communicating with external devices. Each of the ports 0 to 3 has a receive state machine RSM, an arbitration state machine ARSM and a transmit state machine TxSM. The receive, arbitration and transmit state diagrams defining the state machines RSM, ARSM and TxSM are implemented simultaneously for all ports. The transmit portion of the auto-negotiation mechanism for each port provides transmission (Tx) of link pulses (LP) representing auto-negotiation data, and the receive portion provides reception (Rx) of link pulses.

To implement prescribed auto-negotiation operations, the conventional auto-negotiation block requires a substantial number of circuit elements. For example, the auto-negotiation block A-NEG requires about 1100 cells per a port, where a cell is a group of transistors. Each cell may contain about 8 transistors. Thus, for four ports, about 4400 cells are required. Therefore, the conventional auto-negotiation block occupies substantial area on a chip.

It would be desirable to reduce the number of cells required to implement an auto-negotiation system in a multi-port data communication device.

DISCLOSURE OF THE INVENTION

Accordingly, the advantage of the present invention is in providing an auto-negotiation logic circuit shared by all ports of a multi-port data communications device to reduce the number of cells required to implement the auto-negotiation circuit.

This and other advantages of the present invention are achieved at least in part by providing a data communications device that comprises multiple ports for providing communication links with multiple external link partners, and an auto-negotiation circuit for performing an auto-negotiation algorithm to select a mode of communication with the external link partners. The auto-negotiation circuit includes a single state machine for each type of state diagrams defined in the 802.3 standard. In particular, a transmit state machine is provided for transmitting data advertising communication abilities of the data communications device to the external link partners, a receive state machine receives data relating to communication abilities of the exter link partners, and an arbitration state machine controls the transmit and receive machines. The transmit, receive and arbitration state machines are shared by all of the multiple ports to support auto-negotiation with the external link partners coupled to all of the multiple ports.

Each of the transmit, receive and arbitration state machines may sequentially perform operations supporting auto-negotiation for each of the multiple ports. For example, each of the multiple ports may be assigned with a time slot during which each of the transmit, receive and arbitration state machines performs operations supporting auto-negotiation for a corresponding port.

The auto-negotiation circuit further comprises a memory for storing state diagram variables used in operations of the transmit, receive and arbitration state machines respectively defined by transmit, receive and arbitration state diagrams of the IEEE Standard 802.3.

In accordance with a method of the present invention, a separate time slot is assigned to each port of the data communications system. Operations to support auto-negotiation with a link partner connected to a given port of the data communication system are carried out during the time slot assigned to that port.

Still other objects and advantages of the present invention will become readily apparent to those skilled in this art from the following detailed description, wherein only the preferred embodiment of the invention is shown and described, simply by way of illustration of the best mode contemplated of carrying out the invention. As will be realized, the invention is capable of other and different embodiments, and its several details are capable of modifications in various obvious respects, all without departing from the invention. Accordingly, the drawings and description are to be regarded as illustrative in nature, and not as restrictive.

BEST MODE FOR CARRYING OUT THE INVENTION

Although the invention has general applicability in the field of data communications, the best mode for practicing the invention is based in part on the realization of an auto-negotiation system in a Quad Fast Ethernet Transceiver supporting 10 Mbps and 100 Mbps data rates (QFEX 10/100).

Traditional Ethernet networks (10BASE-T) operate at 10 Mb/s Ethernet protocol, as described by IEEE Standard 802.3; the majority of Ethernet interfaces currently operate at this data rate. However, a newer Ethernet standard, under IEEE standard 802.3u, accomplishes the faster operation of 100 BASE-T systems, at 125 Mb/s using unshielded twisted pair (UTP) physical media. The 100 BASE-T standard defines operation over two pairs of category 5 UTP (100 BASE-TX) and over four pairs of category 3 UTD 100 BASE-FX, covered by the 100 BASE-T standard, allows operation over dual fiber optic cabling.

Figure 1:
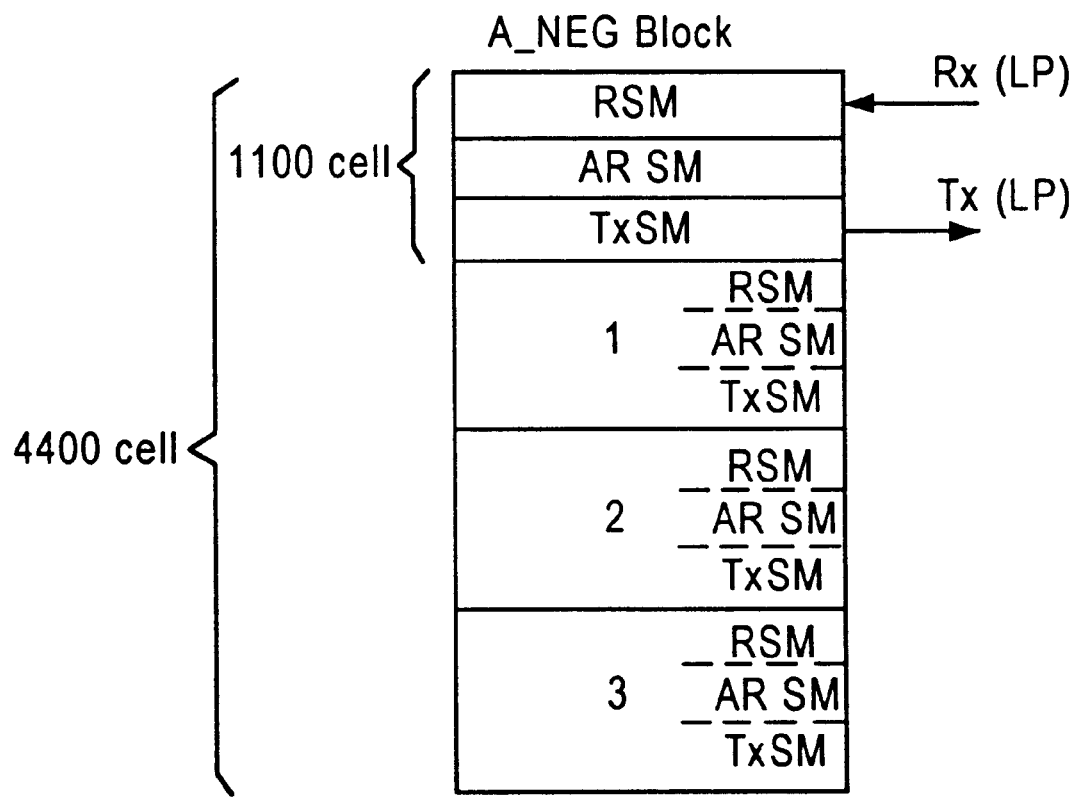
FIG. 1 is a diagram illustrating a conventional auto-negotiation system.
Figure 2:
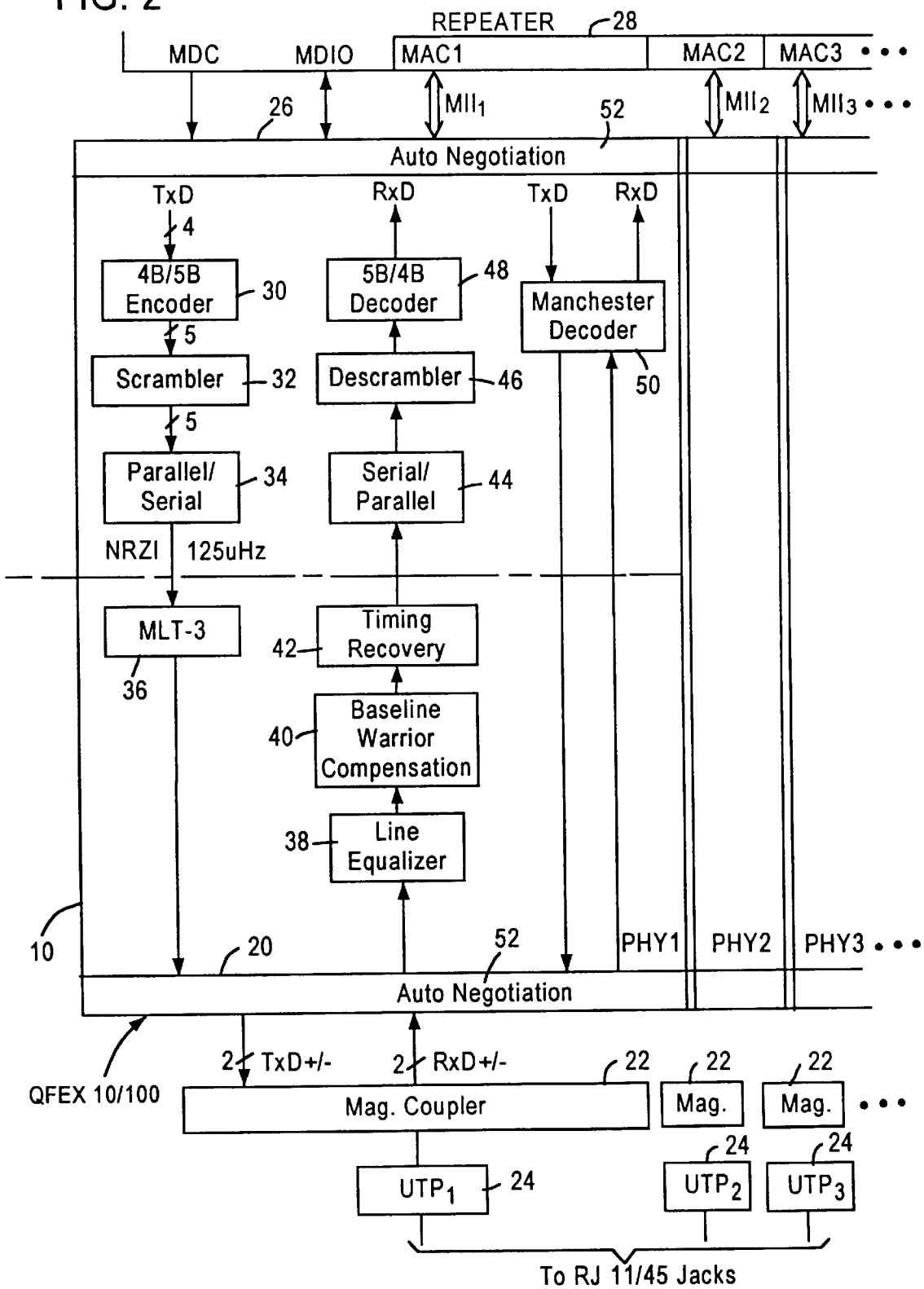
FIG. 2 is a block diagram of a data communications device, in which an auto-negotiation system of the present invention may be employed.

Referring to FIG. 2, a QFEX 10/100 chip 10 has four independent physical layer (PHY) devices PHY1, PHY2, PHY3 and PHY4, each of which is configured for supporting a physical layer interface 20 to a network medium, such as a 100 BASE-TX or 10 BASE-T Ethernet transmission medium. Physical layer devices PHY1 to PHY4 may independently transmit data signals TxD+/− and receive data signals RxD+/− via PHY ports 1 to 4, respectively, to and from external PHY devices, such as 100 BASE-TX devices running at 100 Mbps and 10 BASE-T devices running at 10 Mbps. For example, the data signals TxD+/− and RxD+/− may be 3-level multiple level transition (MLT-3) signals. A set of magnetic transformers 22 is used to connect the physical layer devices to four unshielded twisted pairs (UTP) 24 coupled to corresponding jacks, such as RJ 11/45 jacks.

Also, the QFEX 10/100 chip 10 comprises media independent interface (MII) 26 having four ports MII1, MII2, MII3 and MII4 that support interconnection with four medium access control (MAC) interfaces of a 10/100 repeater or switch 28 running at 10 Mbps or 100 Mbps. Each of the MII ports MII1, MII2, MII3 and MII4 can independently operate in accordance with section 22 of the IEEE 802.3u standard specification to support a MII interface at 100 Mbps or 100 Mbps in a half-duplex or a full-duplex mode. A management data clock (MDC) input and a management data input/output (MDIO) compliant with the IEEE 802.3 standard are arranged to provide management control of the QFEX 10/100.

To support interconnection between the MII ports and the PHY ports, each PHY device of the QFEX 10/100 has two transmit data paths and two receive data paths. In particular, transmit data TxD from each MII port may be transferred to the corresponding PHY port via a 10 Mbps transmit data path or a 100 Mbps transmit data path depending on the data rate of the repeater or switch. Receive data RxD from each PHY port to the corresponding MII port may be supplied via a 10 Mbps receive data path or a 100 Mbps receive data path depending on the data rate at which the external PHY device is running.

For example, each 100 Mbps transmit data path may comprise a 4-bit to 5-bit encoder 30 that outputs 5-bit data, a scrambler 32 that produces pseudorandom non-return-to-zero-inverted (NRZI) data, a parallel to serial shift register 34 producing a 125 MHz NRZI data stream, and an MLT-3 encoder 36 that generates a transmit data signal TxD+/− signal having three levels: 0,+1, and −1.

Each 100 Mbps receive data path may include a line equalizer 36 that performs line equalization to compensate for high frequency attenuation in the twisted pair 24, a baseline wander correction circuit 40 that compensates for lower frequency attenuation caused by the magnetic transformers 22, a timing recovery circuit 42 used to recover the data and the clock to produce synchronous data, a serial to parallel converter 44, a descrambler 46, and a 5-bit to 4-bit decoder 48 that produces 4-bit receive data RxD supplied to the corresponding MII port.

Each of the 10 Mbps receive and transmit paths comprises a Manchester encoder-decoder 50 which decodes Manchester encoded transmit data TxD supplied from the corresponding MII port and encodes the data signals RxD+/− received from the external PHY device. When the external PHY device is run at 10 Mbps, the 100 Mbps transmit and receive paths are bypassed to provide communication via the 10 Mbps transmit and receive paths. The PHY devices PHY1 to PHY4 may contain multiplexers (not shown) that provide switching between 10 Mbps data paths and 100 Mbps data paths.

The QFEX 10/100 chip 10 integrates an auto-negotiation system 52 that performs an auto-negotiation protocol defined in the IEEE Std. 802.3u 100BASE-T supplement Clause 28 to select the best transmission rate and transmission mode based on user requirements and capabilities of the external PHY devices. In particular the auto-negotiation system 52 controls the multiplexers that provide switching between 10 Mbps and 100 Mbps data paths.

Auto-negotiation takes place using Fast Link Pulse (FLP) signals, which are a modified version of the Normal Link Pulse (NLP) signals used for verifying link integrity, as defined in the 10BASE-T specification. The FLP signals may be generated automatically at power-up, and transmitted in bursts every 16±8 ms. Each FLP burst consists of 33 pulse positions, of which 17 odd pulse positions convey clock information, and 16 even pulse positions convey data information. The presence of a pulse in a data pulse position represents a logical 1, whereas the absence of a pulse represents a logical 0.

The data pulse positions form a Link Code Word having bits D0 to D15 corresponding to data being conveyed. In particular, the bits D0 to D4 form a selector field that indicates a device type, e.g. a 802.3 device. The bits D5 to D12 represent a technology ability field that identifies the subset of technology in a specific selector group, e.g. 10BASE-T, 100BASE-TX/T4, full-duplex, half-duplex, etc. A priority table defined in the 802.3 standard is used to ensure that the highest common denominator ability is chosen as a result of auto-negotiation. The full-duplex mode of operation is given higher priority than the half-duplex mode, since a full-duplex system can send more data than a half-duplex link operating at the same speed. Therefore, if the devices at both ends of the link can support full-duplex operation, they will automatically configure themselves for the higher performance full-duplex mode. Further, if both devices on the link can support 100 Mbps data rate, then the auto-negotiation system will configure the PHY device of the QFEX 10/100 to operate at 100 Mbps instead of 10 Mbps.

The bit D13 of the Link Code Word is called a remote fault bit. This bit indicates the presence of a fault from a remote link partner. The bit D14 is an acknowledge bit that acknowledges the successful receipt of 3 identical Link Code Words from a link partner. Finally, the bit D15 is a next page bit that indicates that a device wishes to send at least one additional Link Code Word following the current word being exchanged. For example, if the remote fault bit D13 indicates the presence of a fault, the next page bit D15 may be set to identify the precise type of the fault.

The MII interface 26 provides access to MII management registers involved in an auto-negotiation procedure. The MII management registers may include an advertisement register for holding a Link Code Word to be transmitted, a link partner ability register for storing the received Link Code Word representing the advertised ability of the link partner, and an expansion register for storing miscellaneous auto-negotiation information, such as data relating to ability of the link partner to perform auto-negotiation, and a page received from the link partner. A next page transmit register may be used for holding a next page to be transmitted, if the auto-negotiation system 52 supports the transmission of at least one next page.

If a link partner is a 100BASE-X device with the auto-negotiation ability, the stations on the both ends of the link exchange with the FLP signals. Upon receiving 3 consecutive and consistent FLP bursts, the capabilities of the link partner are recognized, and both stations are configured to transmit at 100 Mbps in a full-duplex or half-duplex mode.

If a link partner is a 10BASE-T device, it responds to the FLP signals send by the QFEX 10/100 by sending back the NLP signals, instead of the FLP signals. The auto-negotiation system 52 detects the NLP signals, and configures the QFEX 10/100 to support the communication in a 10BASE-T mode at 10 Mbps.

In accordance with the 802.3 standard, auto-negotiation is carried out using a receive state machine RSM, an arbitration state machine ARSM and a transmission state machine TxSM respectively defined by receive, arbitration and transmission state diagrams. In particular, the transmit state machine TxSM performs the transmission of the FLP bursts from the advertisement register advertising abilities of the QFEX10/100, ensures a proper separation between pulse positions in the FLP burst, and sends acknowledgements ACK in response to received signals. The receive state machine RSM detects FLP bursts from the link partner and decodes the Link Code Word. The arbitration state machine ARSM controls enabling and disabling of the transmit state machine, transfers the transmit Link Code Word from the advertisement register to the transmit state machine TXSM, transfers the received Link Code Word from the receive state machine to the link partner ability register, and interacts with the MII management registers to provide control and status information. Also, the 802.3 standard defines the NLP receive link integrity test state diagram which are responsible for performing a link integrity test for received NLP signals.

Various statuses of the state machines are represented by state diagram variables defined in the 802.3 standard. For example, the ability_match variable indicates that 3 consecutive Link Code Words match, the acknowledgement_match variable indicates that 3 consecutive Link Code Words match and have the Acknowledge bit set, the link-pulse variable indicates that a valid Link Pulse has been received, the flp_link_good variable indicates that auto-negotiation has completed, etc.

As discussed above, a conventional data communications system uses each of the auto-negotiation state machines defined in the 802.3 standard for each data port. For example, a conventional auto-negotiation block may require about 1100 cells per a port, where a cell is a group of transistors. Therefore, the conventional auto-negotiation block would occupy a substantial area on the QFEX 10/100 chip 10. In accordance with the present invention, the auto-negotiation system 52 of the present invention comprises only one state machine of each type defined in the 802.3 standard for all four PHY ports of the QFEX 10/100.

Figure 3:
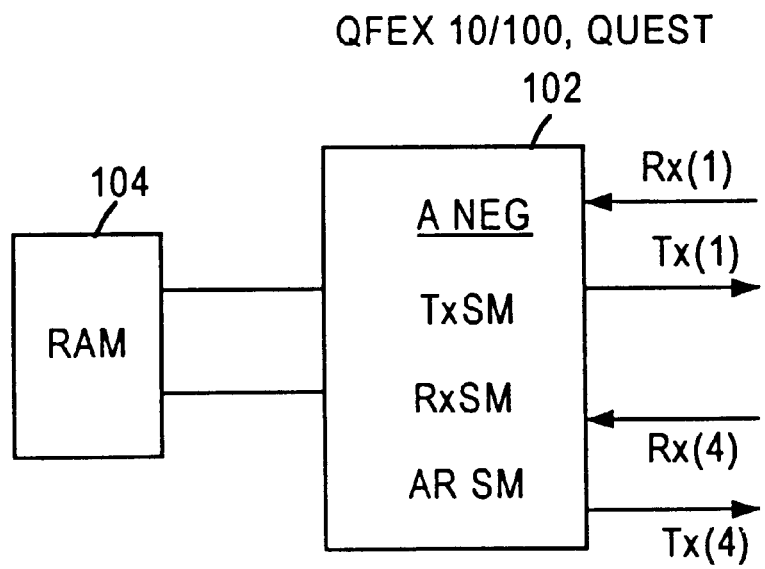
FIG. 3 is a block diagram of the auto-negotiation system of the present invention.

Referring to FIG. 3, the auto-negotiation system 52 of the present invention comprises an auto-negotiation unit 102 and a RAM 104. The auto-negotiation unit 102 includes a single state machine for each type of state diagrams defined in the 802.3 standard. In particular, the auto-negotiation unit 102 includes a transmission state machine TxSM, a receive state machine RXSM, and an arbitration state machine ARSM, which respectively implement the transmit state diagram, the receive state diagram and the arbitration state diagram defined in the 802.3 standard for all four PHY ports of the QFEX 10/100. Thus, instead of using separate state machines for each of the ports, the auto-negotiation system 52 comprises a single state machine of each type for all four PHY ports.

Figure 4:
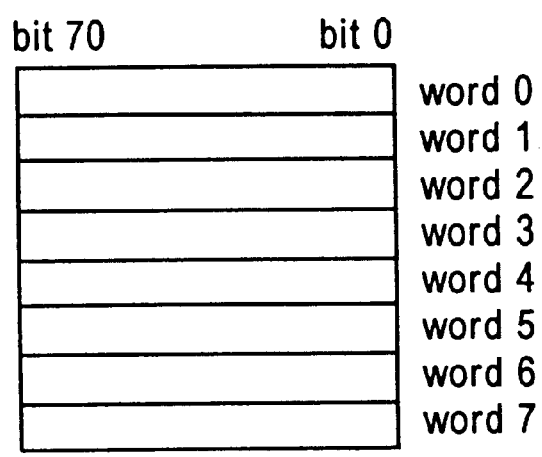
FIG. 4 is a diagram illustrating a memory employed in the auto-negotiation system of the present invention.

The RAM 104 is arranged for storing state diagram variables defined in section 28.2.2.1 of the 802.3 standard. For example, a state diagram variable may be represented by a bit in the RAM 104. As shown in FIG. 4, the RAM may be arranged to store several 71-bit words. Two words of the RAM may be assigned to represent state diagram variables for each port. Therefore, for four ports of the QFEX 10/100, the RAM 104 contains 8 words.

Thus, a single state machine of each type is shared by all four PHY ports. Time-division multiplexing is used to support the state machine sharing. One time slot in each cycle of operations is assigned to each port. During the first time slot, each state machine may perform operations for the first port, during the second time slot, each state machine may support the second port, etc. During a time slot assigned to a given port, the state diagram variables for that port are loaded into the RAM 104, and then are retrieved during the same time slot in the next cycle to continue their processing.

Each state machine of the auto-negotiation unit 102 sequentially performs its operations for each of the PHY ports. For example, during the first time slot of each cycle, state diagram variables for the first PHY port may be written into the RAM 104, while state diagram variables for the second port may be read from the RAM 104. During the second time slot, state diagram variables for the second PHY port may be written into the RAM 104, while state diagram variables for the third PHY port may be read from the RAM 104, etc. For example, the distance between the corresponding time slots may be set to be 800 nanoseconds.

Figure 5:
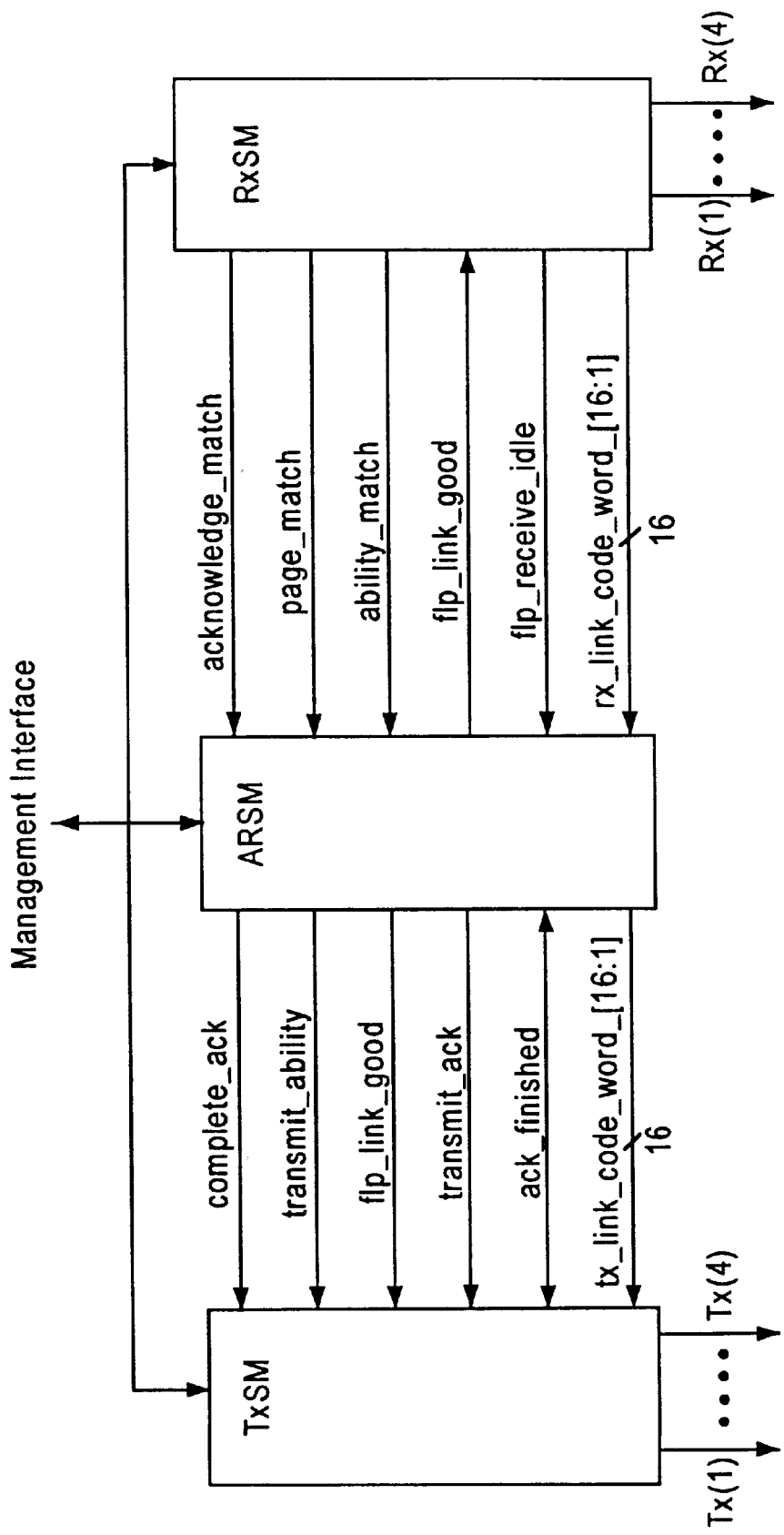
FIG. 5 is a functional diagram illustrating interactions between transmit, receive and arbitration state machines.

FIG. 5 shows a functional diagram illustrating interaction between the transmit TxSM, receive RxSM and arbitration ARSM state machines in the auto-negotiation unit 104. The transmit state machine TxSM provides the transmission of transmit signals Tx(1) to Tx(4) including corresponding FLP bursts via the PHY ports 1 to 4, respectively, of the QFEX 10/100.

The arbitration state machine ARSM enables the transmission of the FLP bursts by sending to the transmit state machine TxSM the transmit_ability variable that controls the transmission of the Link Code Word having the tx_link_code_word[16:1] also transferred from the arbitration state machine ARSM to the transmit state machine TxSM. The tx_link_code_word[16: 1] is a 16-bit array containing data bits to be transmitted in an FLP burst.

Further, the arbitration state machine ARSM supplies the transmit state machine TxSM with the transmit_ack variable that controls the setting of the Acknowledge bit in the tx_link_code_word[16:1] to be transmitted. The complete_ack variable controls counting of the transmitted Link Code Words that have their Acknowledge bit set. The ack_finished variable sent by the arbitration state machine ARSM to the transmit state machine TxSM indicates that the final Link Code Words with the Acknowledge bit set have been transmitted.

Receive signals Rx(1) to Rx(4) for PHY ports 1 to 4, respectively, of the QFEX 10/100 are supplied to the receive state machine RxSM, which sends to the arbitration state machine ARSM state diagram variables acknowledge_match, page_match, ability_match, flp_receive_idle and rx_link_code_word_[16:1] for the corresponding ports. The acknowledge_match variable indicates that 3 consecutive Link Code Words match and have the Acknowledge bit set. The page_match indicates that the received page matches. The ability match variable indicates that 3 consecutive Link Code Words match, ignoring the Acknowledge bit. The flp_receive_idle variable indicates that the receive state diagram is in the idle state. Finally, the rx_link_code_word_[16:1] variable is a 16-bit array that contains the data bits received from an FLP burst.

When auto-negotiation is complete, the arbitration state machine ARSM supplies the receive state machine RxSM and the transmit state machine TxSM with the flp_link_good variable to place the receive and transmit state machines to an idle state.

The arbitration state machine ARSM via a management interface interacts with the MII management registers that provide management and control of the auto-negotiation procedure. As discussed above, the MII management registers include an auto-negotiation advertisement register, an auto-negotiation link partner ability register, an auto-negotiation extension register, and an auto-negotiation next page register.

The auto-negotiation advertisement register is provided for each PHY port of the QFEX 10/100 to store data representing the advertised ability of the QFEX 10/100. The bits of this register may advertise to the link partner device the ability of the QFEX 10/100 to support full-duplex and half-duplex 100BASE-TX operations, and full-duplex and half-duplex 10BASE-T operations. Via the arbitration state machine ARSM, data from the advertisement register are transferred to the transmit state machine TxSM for transmission to a link partner.

The auto-negotiation link partner ability register provided for each PHY port of the QFEX 10/100 contains data relating to the advertised ability of the link partner. These data are transferred from the receive state machine RxSM via the arbitration state machine ARSM.

The auto-negotiation expansion register provides additional auto-negotiation information such as ability of the link partner to support auto-negotiation or a next page mode, and the auto-negotiation next page register contains the next page Link Code Word to be transmitted.

As discussed above, the transmit state machine TxSM, the receive state machine RXSM and the arbitration state machine ARSM are shared by all four PHY ports of the QFEX 10/100. Auto-negotiation data relating to each of the ports are processed by the state machines in a time-division multiplexing fashion during a time slot assigned for each port. As only one state machine of each type is used for all four ports, the chip area occupied by the auto-negotiation unit of the present invention is substantially reduced.

In this disclosure, there are shown and described only the preferred embodiments of the invention, but it is to be understood that the invention is capable of changes and modifications within the scope of the inventive concept as expressed herein.

What is claimed is:

1. A data communications device comprising:
   multiple ports for establishing communications links with multiple external link partners, and
   an auto-negotiation circuit for performing auto-negotiation to select a mode of communication with the external link partners,
   said auto-negotiation circuit includes:
      a transmit state machine for performing transmission of link pulses to the link partners,
      a receive state machine for performing reception of link pulses from the link partners, and
      an arbitration state machine for coordinating transmission and reception procedures, said transmit, receive and arbitration state machines being shared by all of said multiple ports to support auto-negotiation with the external link partners coupled to all of said multiple ports,
      wherein each of said multiple ports is assigned with a time slot during which each of said transmit, receive and arbitration state machines performs operations for a corresponding port.

2. The device of claim 1, wherein each of said transmit, receive and arbitration state machines sequentially performs operations for each of said multiple ports.

3. The device of claim 1, wherein said auto-negotiation circuit further comprises a memory for storing state diagram variables used in operations of said transmit, receive and arbitration state machines.

4. The device of claim 1, wherein said transmit, receive and arbitration state diagrams are compliant with IEEE Standard 802.3.

5. The device of claim 1, wherein said auto-negotiation circuit supports auto-negotiation for a full-duplex or half-duplex mode of transmission.

6. The device of claim 1, wherein said auto-negotiation circuit supports auto-negotiation for transmission at a first data rate or at a second data rate.

7. The device of claim 6, further comprising a first data path for each of the ports to support transmission at the first data rate.

8. The device of claim 7, further comprising a second data path for each of the ports to support transmission at the second data rate.

9. An Ethernet transceiver, comprising
   a media independent interface (MII) for communicating with a MII data communication device,
   a physical layer (PHY) interface having multiple PHY ports for establishing data links with multiple link partners,
   a first data path established between each of the PHY ports and the MII interface for providing data communications at a first data rate,
   a second data path established between each of the PHY ports and the MII interface for providing data communications at a second data rate, and an auto-negotiation circuit for performing auto-negotiation with each of the multiple link partners to select between data communications at the first data rate and at the second data rate, said auto-negotiation circuit operating in a time-division multiplexing mode to sequentially support auto-negotiations for each of the PHY ports, wherein said auto-negotiation circuit performs operations for a given PHY port during a time slot assigned to that PHY port.

10. The transceiver of claim 9, wherein said auto-negotiation circuit comprises a transmit state machine for transmitting data advertising communication abilities of the transceiver to the link partners.

11. The transceiver of claim 10, wherein said auto-negotiation circuit further comprises a receive state machine for receiving data relating to communication abilities of the link partners.

12. The transceiver of claim 11, wherein said auto-negotiation circuit further comprises an arbitration state machine for controlling said transmit and receive state machines.

13. The transceiver of claim 12, wherein said transmit, receive and arbitration state machines being shared by all of said PHY ports.

14. In a multi-port data communications system, a method of auto-negotiation with multiple link partners comprising the steps of:

assigning a separate time slot to each port of the data communications system, carrying out operations to support auto-negotiation with a first link partner connected to a first port of the data communication system during a first time slot assigned to the first port, and carrying out operations to support auto-negotiation with a second link partner connected to a second port of the data communication system during a second time slot assigned to the second port and following the first time slot.

* * * * *